United States Patent [19]

Zoltan

[11] 4,115,734

[45] Sep. 19, 1978

[54] LAMINATED DRIVER COIL FOR RECORDER PEN DRIVE MECHANISM

[75] Inventor: Steven I. Zoltan, Shaker Heights, Ohio

[73] Assignee: Gould Inc., Rolling Meadows, Ill.

[21] Appl. No.: 748,833

[22] Filed: Dec. 9, 1976

[51] Int. Cl.² .......................... G01R 5/06; G01R 1/04
[52] U.S. Cl. .................................. 324/151 A; 29/605; 324/154 R; 346/139 R
[58] Field of Search ........... 324/151 R, 151 A, 154 R, 324/154 PB, 155; 335/222; 29/605; 336/208; 346/139 R

[56] References Cited

U.S. PATENT DOCUMENTS

| | | | |
|---|---|---|---|
| 1,041,293 | 10/1912 | Keller | 29/605 |
| 2,840,767 | 6/1958 | Ammon | 324/151 A X |
| 3,068,412 | 12/1962 | La France | 324/155 |
| 3,348,302 | 10/1967 | Foerster | 29/605 |
| 3,405,360 | 10/1968 | Hayter | 324/154 R |
| 3,587,014 | 6/1971 | Nador | 335/222 |
| 3,597,686 | 8/1971 | Kain | 324/154 R |
| 3,786,353 | 1/1974 | Pun | 324/154 R |
| 3,963,882 | 6/1976 | Lewis | 29/605 X |
| 3,983,478 | 9/1976 | Pearson | 324/154 R |

*Primary Examiner*—Gerard R. Strecker
*Attorney, Agent, or Firm*—Eber J. Hyde

[57] ABSTRACT

A pen recorder driving mechanism for deflecting a recorder pen on a writing medium in response to electrical input signals is disclosed. The improved pen recorder driving mechanism includes a novel laminar coil assembly rotatably mounted in a precision air gap between a permanent inner core magnet and a highly permeable outer shell. The coil assembly comprises a coil frame having an inner frame around which the windings of a driving coil are wound and an outer frame overlayered on the windings and the inner frame. The coil frame laminations are rigidified by a bonding material applied to the windings during their assembly. The coil frame is subsequently shaped into a generally rectangular concave convex configuration by stretching the laminations during manufacture with a forming tool. Half shafts and end pieces are attached to the transverse legs of the coil frame after shaping to define the rotational axis of the coil assembly and to provide a mounting structure.

5 Claims, 11 Drawing Figures

LAMINATED DRIVER COIL FOR RECORDER PEN DRIVE MECHANISM

BACKGROUND OF THE INVENTION

1. Field of the Invention

The invention pertains generally to pen recording apparatus used in making visual records of an electrical input parameter and is more particularly directed to driving mechanisms for such recorders.

2. Description of the Prior Art

In the past pen recorders have been equipped with driving mechanisms for the pen assemblies which include a coil assembly rotatably mounted within a stator assembly. The stator assembly is generally provided with a permanent magnet arrangement coupled through an air gap to a highly permeable flux path. The coil assembly rotates in the air gap due to an electrical signal applied to a driving coil. The amount of rotation or deflection is functionally related to the amplitude of the electrical signal applied. A recorder pen or stylus is physically attached to the coil assembly to record the deflection associated with the amplitude of the signal as a visual trace on a recording medium, such as chart paper or the like.

These driving mechanisms for pen recorders, normally called "penmotors" are usually designed to include a low inertia coil assembly. These coil assemblies are generally self-supporting or frameless because low coil inertia is a prerequisite for a high speed recording operation.

The frameless coil assembly further includes a through shaft on which to mount the coil for rotation. It has been found that the presence of a one-piece shaft extending lengthwise through the core magnet and mechanically attached to supporting members of the coil structure greatly enhances the structural rigidity of the coil assembly, such that it will not be deformed as a result of stresses incurred during normal operation. This is important to insure that undesired extraneous mechanical deflections will not occur to affect the accuracy and the stability of the overall drive system.

Examples of advantageous penmotors having a centrally mounted axial shaft through a core magnet or a permeable core and the coil assembly are found in U.S. Pat. No. 3,088,788 issued to A. D. Brown Jr. et al and U.S. Pat. No. 3,550,156 issued to A. R. Thompson.

However, the through shaft construction does present certain difficulties for manufacturing the coil assembly. The coil windings are usually wound first and the shaft inserted through the coil by parting the windings. Partition of the windings must be accomplished with care as the insulation on the wire can be easily damaged causing a failure of the mechanism at a future date. Such a delicate operation is time consuming and adds unnecessarily to the expense of manufacturing penmotors. It has been suggested previously that the coils be wound already partitioned but experience had shown that the coil assembly cannot readily be wound in this manner.

Another disadvantage with through shaft construction is that the axial shaft must be located through the core. This through shaft mounting requires further processing of the core to provide a centrally located aperture for the placement of the axial shaft. An aperture of this sort will degrade the performance of a core magnet as it interferes with the domain orientation and poling of the magnet. Such a degradation of the magnetic field will reduce the torque the penmotor can provide to deflect the coil assembly.

The assembly of the through shaft and a core magnet are also matters of concern. The through shaft construction necessitates that the coil assembly be assembled around the core magnet and that the delicate coil to shaft bonding and partition process be performed at this state.

This adds complexity to the already difficult manufacture. Moreover, it is relatively difficult to maintain nearly precise concentricity between the coil assembly and the core magnet since the coil assembly must have clearance around the core magnet and the through shaft must rotate with clearance in the core magnet aperture without binding.

The lack of precision tolerances stemming from the non concentricity introduced during assembly can cause other effects such as a long air gap. The shorter an air gap is made, the higher the flux density that can be maintained within the gap which can contribute significantly to the torque generated by the motor. Also, if the gap can be shortened, a more efficient heat transfer between the coil assembly and the outside shell will occur to improve performance.

SUMMARY OF THE INVENTION

The invention provides a penrecorder driving mechanism which substantially solves many of the problems found in the prior art. Included in the driving mechanism is a coil assembly without a through shaft. The elimination of the through shaft obviates the difficult assembly and construction problems heretofore encountered in penmotors.

The coil assembly comprises a coil frame having an inner frame on which the conductive windings of the driving coil are wound and an overlayered outer frame. The laminations are rigidified by a bonding material applied to the windings. The coil assembly is then formed by stretching the laminated inner and outer frames into a generally rectangular concave convex shape which substantially coincides with the arcuate air gap between the core magnet and the outer shell. Half-shafts fixed on end pieces laminated to the coil frame are provided at both ends to define the axis of rotation for the coil assembly.

According to one aspect of the invention, the stretching into a concave convex shape develops equal stains in all parts of each cross section of the frames. Further, the coil windings if stretched in this manner are not formed into different lengths during the process.

Advantageously the laminar construction of the coil assembly produces sufficient torsional rigidity to eliminate the through shaft completely and to allow a core magnet without an aperture therein. The laminar construction uses very light frame thicknesses to keep the inertia low while maintaining strength.

A further advantage of the invention is an increased manufacturing precision for the coil assembly. The stretching process produces the ability to control the ultimate size and shape of a thin coil assembly to excellent tolerances. With a precisely dimensioned coil assembly according to another aspect of the invention a shorter air gap may be used to provide a higher flux density and a consequent greater torque output from the penmotor. Further, a shorter air gap is a better conductor of heat to the outer shell of the motor thereby increasing the dissipation of heat energy from the coil.

Improved performance from being able to apply more power will result.

Therefore, it is an object of the invention to provide an improved pen recorder driving mechanism with increased operating ranges and performances.

A further object of the invention is to simplify the manufacture of such pen recorder driving mechanisms.

A still further object of the invention is to provide a torsionally rigid laminar coil assembly that does not rely on a through shaft.

Another object of the invention is to provide a coil assembly for a pen recorder driving mechanism capable of producing a greater torque than conventional pen motors.

An additional object of the invention is to provide a coil assembly that can be manufactured to more precise tolerances.

These and other objects, features, and advantages of the invention will be more fully understood and appreciated upon reference to the following detailed description taken in conjunction with the appended drawings wherein:

BRIEF DESCRIPTION OF THE DRAWINGS

In the drawings the convention that identical reference numerals indicate the same structure throughout the different views is maintained.

DETAILED DESCRIPTION OF THE PREFERRED EMBODIMENT

Figure 1:
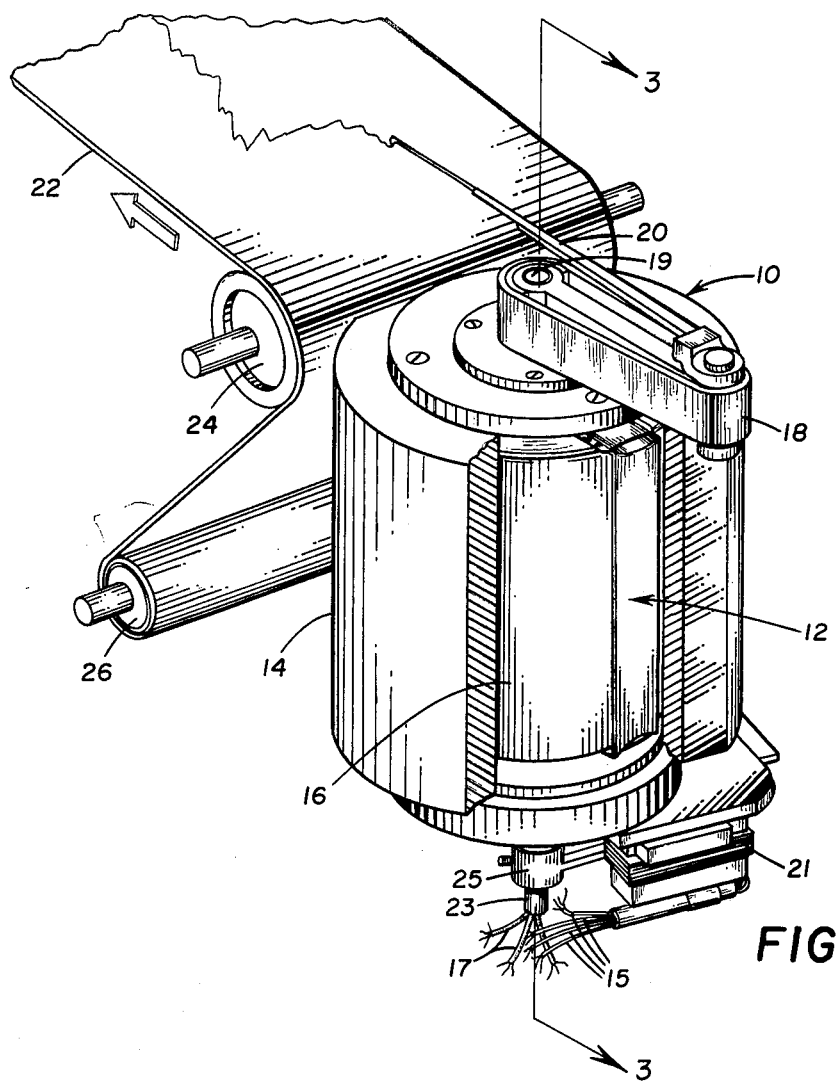
FIG. 1 is a perspective view, partially in section, of a pen recorder system constructed in accordance with the invention illustrating a driving mechanism in detail.

With reference now to the first illustration, FIG. 1, there is shown a pen recorder system including a driving mechanism 10 constructed in accordance with the invention. The driving mechanism 10 has a coil assembly 12 mounted for rotation within a substantially annular outer shell 14. Coaxially positioned within the outer shell 14 and aligned with the axis of rotation of coil assembly 12 is a solid cylindrically shaped inner core magnet 16.

Generally, the coil assembly 12 rotates or deflects in response to electrical signals applied via terminal leads 17. The current flowing through the windings of the coil assembly 12 in response to the electrical signals will coact with the magnetic flux developed between the outer shell 14, and inner core magnet 16 to produce a torque on the coil assembly proportional to the current.

In a conventional manner, the deflection of the coil assembly 12 is used to drive a recording apparatus such as a pen assembly 18. The pen assembly 18 is connected to the coil assembly 12 at the vertical upper half shaft 19 and effectuates the lateral crossings of a pen 20 on a transversely moving record medium 22 such as chart paper or the like. Thus as the record medium is passed over a positioning roller 24 from a supply roll 26 in the direction of the arrow, a visual trace representative of the electrical signal applied to the terminal leads 17 is recorded on the medium 22 by the pen 20.

A transducer 21, connected to the coil assembly 12 through a transducer arm 25, and lower half shaft 23 is used to provide a feedback position signal indicative of the pen position.

The terminal leads 17 and transducer leads 15 can be connected to an electrical control circuit (not shown) which will provide the electrical signals to the coil assembly from a driving amplifier in a conventional manner. Usually, an input signal representative of a physical quantity such as pressure, temperature, resistance, etc. will be combined with the feedback signals developed by the transducer 21, a velocity source, and other compensating signals to form the controlling signal to the driving amplifier. Preferably, the coil assembly 12 has an internally wound driving coil. Further, the driving mechanism 10 may include a bucking coil and or velocity coil for compensation as is known in the art.

The pen assembly 18 and an electrical control circuit adapted to drive a pen motor of this type with a position feedback signal transducer similar to that indicated at 21, detailed descriptions of which are not needed for an understanding of the invention, are more fully described in the before referenced U.S. Pat. No. 3,281,688 issued to Brown et al, the disclosure of which is hereby fully incorporated by reference.

Figure 2:
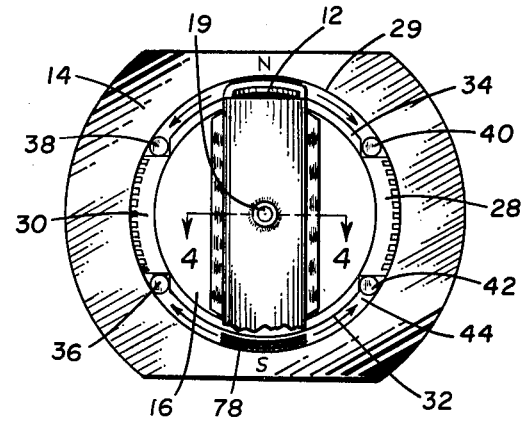
FIG. 2 is a top view of the pen recorder driving mechanism illustrated in FIG. 1.

Turning now to FIG. 2, the positioning of the coil assembly 12 between the inner core magnet 16 and the outer shell 14 is illustrated. The upper portion of the driving mechanism 10 has been removed for clarity in the description.

The outer shell 14 formed of a highly permeable material has a cylindrical bore passing therethrough defined by an inner surface 29. Concentrically mounted within the bore of the outer shell 14 and precisely positioned by arcuately shaped spacer shoes 28 and 30 is the cylindrical inner core magnet 16.

The spacer shoes 28, 30 extend longitudinally the length of magnet 16 and are provided with deformable fins on their outer periphery which abuts the inner surface 29. Preferably the spacer shoes 28, 30 are manufactured from a heat conducting and nonmagnetic material such as aluminum. The fins deform during the mounting of the magnet 16 to take up excess tolerances.

Attached to the inner core magnet 16 by an epoxy adhesive or other conventional method is a pair of arcuately shaped pole shoes 32, 34. The pole shoes are centered on the opposing north, south pole orientations of the cylindrical inner core magnet 16 which is poled in the direction of a transverse axis. The pole shoes are preferably formed of a highly permeable material and extend longitudinally the length of the inner core magnet 16.

The pole shoes provide a means for easily mounting the inner core magnet 16 within the center of the coil assembly 12 which has arcuate side legs of the same general shape as an air gap 44. The greater clearance of the circumference of the magnet 16 not covered by the pole shoes is used for centering the magnet within the coil assembly 12. The inner core magnet 16 and pole shoes 32, 34 are then rotated one quarter turn to align the poles and pole shoes of the magnet within the coil assembly 12. The combination of the coil assembly 12 and inner core magnet 16 are then positioned by the spacer shoes 28, 30 to form the precision air gap 44. During mounting the core magnet is bonded to the spacer shoes 28, 30 to fix its position within the bore.

Alternatively, the inner core magnet 16 could have straight edged cut outs on either side of the North, South poles to provide clearance for mounting within the coil assembly 12 instead of the pole shoes provided. Of course, with such a configuration the spacer shoes 28, 30 would have a flat inner edge machined for aligning the core magnet concentric to the inner bore. The pole shoe configuration is preferred as it permits magnetic alignment of the magnet 16 more easily than does the cut out method.

The air gap 44 can be shorter than air gaps usually found in pen motor driving mechanism because, according to the invention, the coil assembly can be reproducibly manufactured to closer tolerances and the necessary clearance heretofore used is reduced. Also, the elimination of the through shaft permits concentric alignment and a reduction of clearance between the coil assembly 12, the inner bore of the shell 14, and the core magnet 16.

Normally, in penmotors such as described in Brown et al having a through shaft, air gaps on the order of 80 mils with a flux density of 4000–5000 gauss have been common. In the driving mechanism 10 an air gap on the order of 35 mils with a flux density of approximately 8000 gauss can be generated using a solid cylindrical core magnet of a permalloy, Alnico 5, and a highly permeable outer shell 14 of soft magnetic material. In an air gap of this dimension, the coil assembly 12 will be preferably no greater than 20–22 mils in thickness and the remainder clearance.

The coil assembly 12 can be freely deflected in the air gap 44 along the pole shoes in the directions of the arrows. At the outwardly extents of the deflection arcs are set of soft plastic rod shaped bumpers 36, 38, 40, 42 to protect the coil assembly from any destructive over excursions.

The short precision air gap 44 of this configuration produces the further advantage of having increased heat dissipation from the coil assembly. In the configuration described the heat produced by the current flowing through coil assembly windings is efficiently transferred to the inner core and outer shell via the narrow air gap. Long air gaps provide excessive insulation in the form of a thick air layer and may allow a temperature rise in a coil assembly and secondarily increase resistance and power loss. The small clearances of the present coil assembly 12 result in excellent heat transfer between the assembly and the outer shell 14 whereby a temperature increase as low as 3° C./watt has been achieved.

There has been shown above a preferred configuration for the driving mechanism 10 where a central core magnet without an aperture is coupled magnetically through the air gap 44 to a highly permeable outer shell. Alternatively, the central cylindrical portion can be used as a highly permeable flux path with the outer shell having arcuately shaped magnetic poles.

Figure 3:
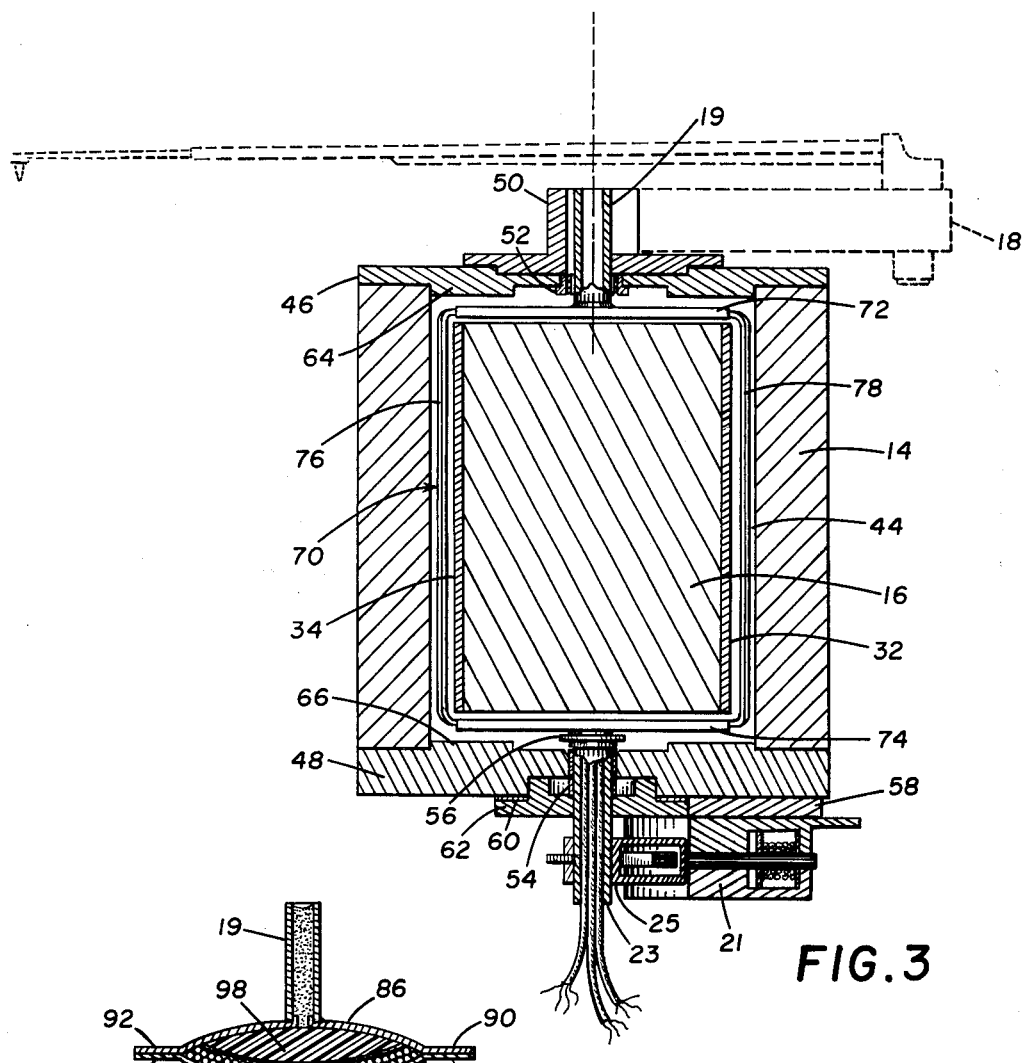
FIG. 3 is a cross sectional view of the driving mechanism taken along section line 3—3 in FIG. 1.

As is illustrated in FIG. 3, the air gap 44 extends longitudinally the length of the inner core magnet 16 and pole shoe 32, 34 to the inner face of the shell 14. The concentric positioning of the coil assembly 12 within the air gap 44 and round the core magnet 16 is ensured by a lower bushing 54 and upper mounting bearing 52 which journal the lower half shaft 23 and upper half shaft 19 respectively of the coil assembly for rotation.

The outer race of the ball bearing 52 is press fitted into an aperture drilled through a generally disc shaped upper casing cap 46. The bushing 54 is located in an aperture bored coaxially therewith in a lower casing cap 48. The casing caps 46, 48 are positioned coaxially with the inner bore of the shell 14 by having generally annular shaped raised portions 64, 66 respectively extending into the bore.

The upper rim of bushing 54 supports a thrust washer 56 on which the coil assembly 12 rotates while the lower rim of the bushing rests on the surface of a cylindrical relieved section of a generally disc shaped support sleeve 62. The outer flange of the support sleeve 62 is provided with a spacer ring 60 to position its lower surface evenly with that of a mounting plate 58. The transducer 21 is mounted on the plate 58 and support sleeve 62.

The half shafts of the coil assembly 12 extend through the upper and lower casing caps 46, 48 to permit motive attachments thereto. The upper half shaft 19 which drives the pen assembly 18 (shown in phantom) fits into the bore of a pen assembly mounting housing 50 which mounts into a circular recess in the upper casing cap 46. The lower half shaft protrudes from the bushing 54 through an opening in the support sleeve 62 to drive the transducer arm 25. The transducer arm 25 pinned to the shaft 23 swings freely within the field of the transducer core lamination to produce the position feedback signal.

The lower half shaft 23 importantly acts as a conduit for the terminal leads 17 from the windings of the coil assembly. The leads are shielded in this manner and are not exposed to extensive twisting or flexure which may cause their breakage. Moreover, the electrical leads are less likely to bind or become entangled between any moving surface of the rotating coil assembly and adjacent structure.

With more particularity the coil assembly 12 includes an integrally formed generally rectangular or square coil frame 70 having an upper transverse leg 72 and a lower transverse leg 74 connected on either end by the longitudinally extending side legs 76, 78. The side legs are substantially arcuate in shape and of similar curvature to the air gap 44 in which they rotate. The laminar construction and shape of side leg 78 is more clearly illustrated in cross section in FIG. 2.

The transverse legs 72, 74 have a similar arcuate curvature to the side legs 76, 78 but as will be more fully explained hereinafter, the curvature is directed inwardly to the coil frame 70 as opposed to the outwardly directed curvature of the transverse legs.

Figure 4:
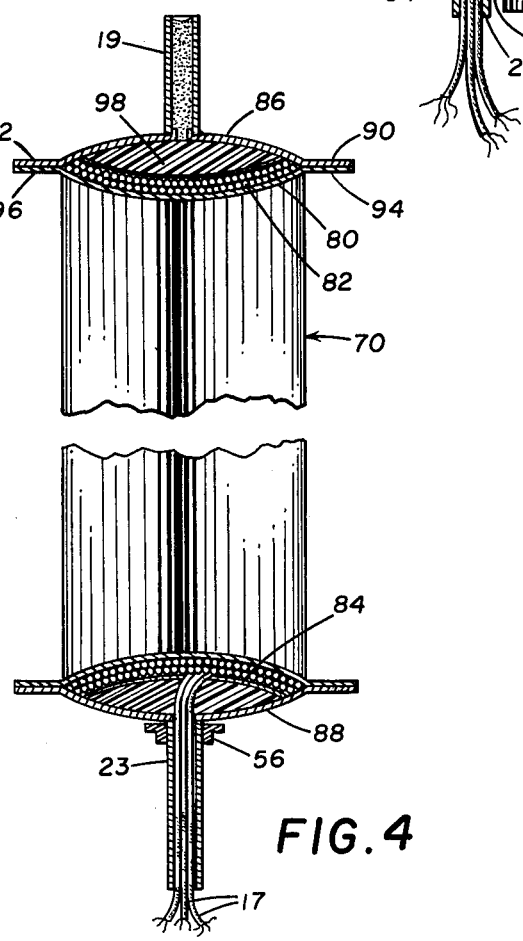
FIG. 4 is a cross sectional view of the coil assembly for the driving mechanism taken along section line 4—4 in FIG. 2.

As can be seen more clearly in the cross sectional view of FIG. 4, the coil frame 70 has a laminar construction comprising an inner frame 80, a plurality of windings 82 forming preferably the driving coil and a velocity coil, if used, and an outer frame 84. These three laminations are held together with a bonding material to form the coil frame 70 in the compound shape hereinafter described. Overlaying the transverse legs 72, 74 are a top end piece 86 and a bottom end piece 88. Each end piece, for example 86, has an arcuate curvature that is opposite to that of the transverse leg associated therewith and a pair of laterally extending tabs 90 and 92 which are fixed to corresponding tabs 94 and 96 of the inner frame 80 by welding, soldering, or the like.

The interspaces formed by the oppositely directed curvatures of the transverse legs and the end pieces are filled with a bonding material 98 which further rigidifies the composite structure of the coil frame and end pieces in a laminar form similar to the coil frame. On the end pieces are welded tubular half shafts 19, 23 defining the longitudinal rotational axis for the coil assembly 70. The insulated electrical leads 17 are brought from the windings 82 via the inner bore of the half shaft 23 and an aperture in the bottom end piece 88.

Figure 11:
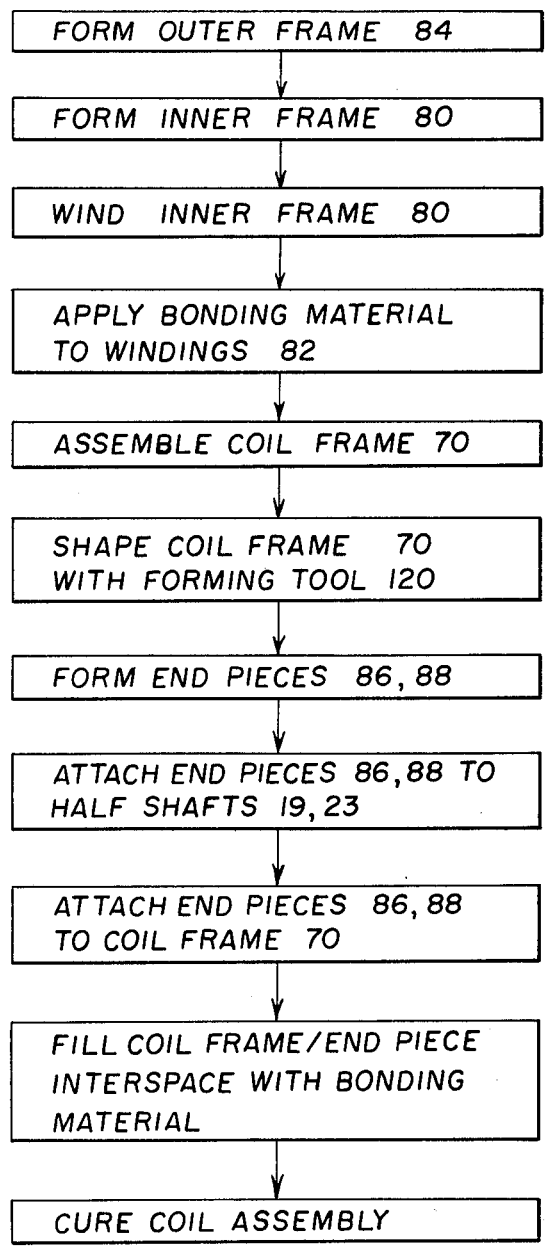
FIG. 11 is a representative flow diagram of the sequence of steps used to manufacture the coil assembly illustrated in FIG. 3.

The method for making the coil assembly 12 will now be broadly outlined with reference to the flow chart of steps in FIG. 11. Initally, the inner frame 80 and the outer frame 84 are each formed into a ring shape. Then the windings 82 of the driving coil and a velocity coil if used, are wound on the inner ring frame 80 and have an application of bonding material applied to them. Before the bonding material is cured the outer frame 84, inner frame 80, and windings 82 are assembled into a laminar ring structure and subsequently shaped by a forming tool 120 into the generally rectangular or square coil frame 70. Subsequently, the end pieces 86, 88 are formed and attached to the half shafts 9, 23. At this time the coil frame 70 is attached to the end pieces 86, 88. In an additional step bonding material is used to fill the interspaces between the end pieces and the coil frame. Finally, the coil assembly 12 is cured to allow the bonding material to harden and rigidify the structure.

Figure 5:
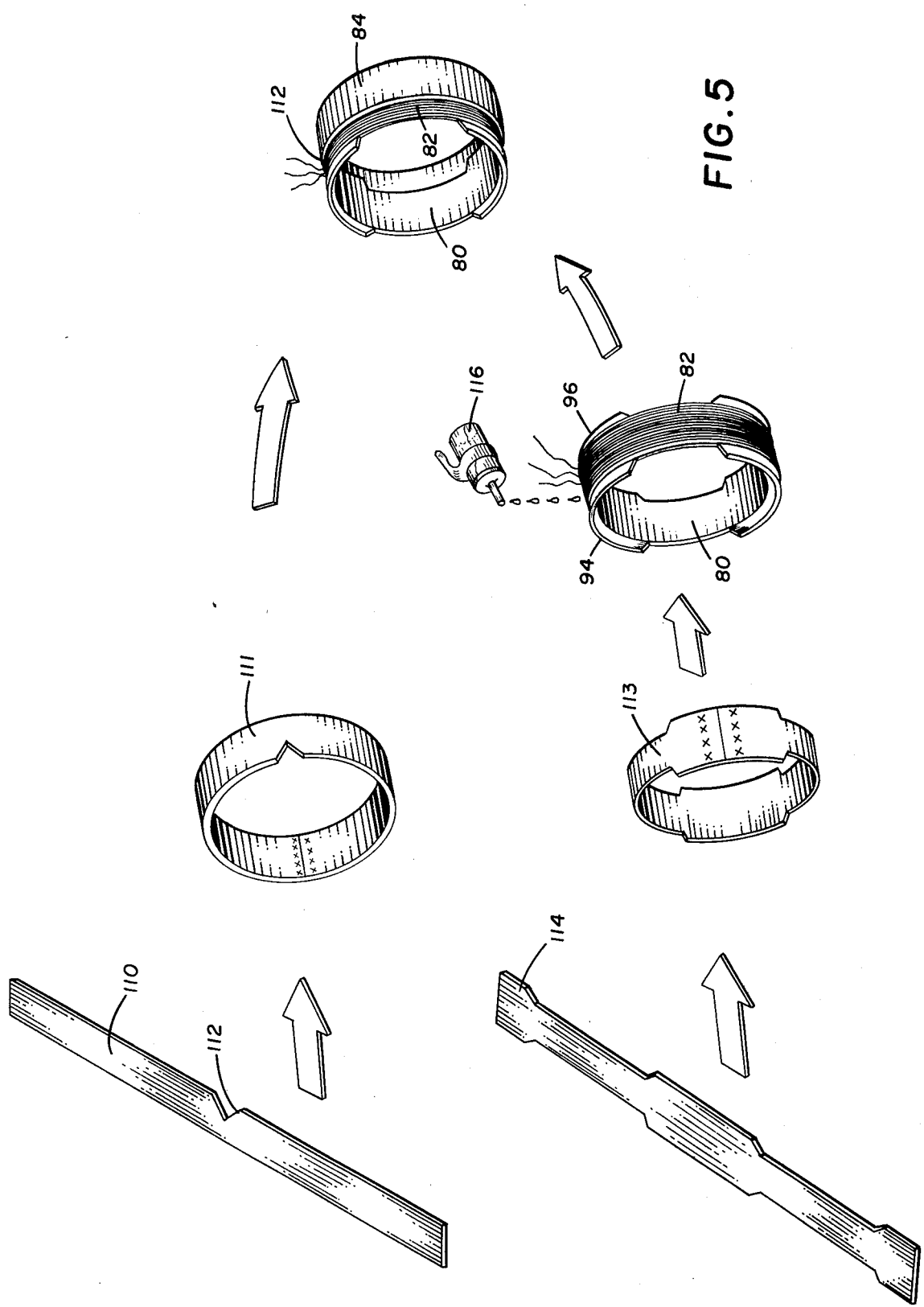
FIG. 5 is a perspective assembly drawing of the coil windings with the inner and outer support frames for the coil assembly illustrated in FIG. 4.

The individual method steps for forming the coil assembly 12 will now be more particularly described. The formation of the coil frame 70 will be better illustrated by reference to FIG. 5. The outer frame 84 is constructed of a flexible strip 110 which is bent into ring 111 by attaching its ends together by electrical welding or the like. Preferably, the material is a nonmagnetic strip of stainless steel approximately 0.002 inches in thickness. The outer frame 84 includes a notch 112 which later provides access to the windings 82 on the inner frame 80.

The inner frame 80 is similarly formed into a ring 113 by the adjoining of the two ends of a generally flat flexible strip 114 by electrical welds or the like. The strip 114 preferably is also formed of nonmagnetic stainless steel of approximately 0.002 in thickness. The strip 114 has been cut out to leave tabs, such as tabs 94, 96 remaining.

The driving coil and the optional velocity coil windings 82 are now wound on the inner frame 80 in a conventional manner. To facilitate the winding process the tabs 94, 96 can be bent slightly upwards to form a channel for guiding the windings 82. The inner frame 80 can be stretched by a ring arbor to a stop to bend the tabs upwardly and for assuring its dimension. For a driving coil with a resistance of 10 ohms, which will normally match the impedance of a conventional driving amplifier, it is preferred to use two layers of Isonel insulated 32 gauge annealed copper wire approximately 18 mils thick overall. The velocity coil can be wound as is conventional to match the characteristics of the control circuitry.

When the driving and velocity coils have been wound, the inner frame 80 has an application of bonding material 116 applied. The bonding material is applied to saturate the windings and preferably is an epoxy adhesive with the trade name of Stycast 1217 made by Emerson & Cummings of Canton, Mass.

The bonding material 116 can also be any one of a number of adhesive agents which rigidify upon the application of heat, pressure, time or other process steps. The bonding material should flow easily to provide a thin but saturating covering of the windings. The function of the bonding material is to hold the laminations of the coil frame together rigidly after setting up without deformation under moderate temperatures and the invention is not limited to using any one bonding material.

The assembly of the coil frame 70 is completed after the winding step by positioning the outer frame 84 over the inner frame 80, windings 82 and bonding material to form a slip fit. This step provides a laminar ring shaped structure which can be stretched into the final generally rectangular or square form of the coil frame 70.

Figure 6:
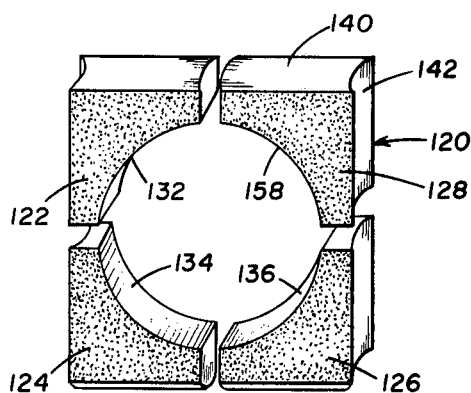
FIG. 6 is a perspective view of a forming tool used to stretch the coil frame illustrated in FIG. 5 into a complex shape.

In FIG. 6 a specially shaped forming tool 120 is used for stretching the coil frame 70 after it is assembled into the laminar ring of the inner frame, windings and outer frame. The forming tool 120 comprises four mateable section blocks 122, 124, 126, 128 that together generally form a right parallelepiped. The blocks 122, 124, 126, 128 have semi-circular inner faces 132, 134, 136, 138 which when joined provide a central mounting aperture. The tool 120 is provided in four blocks to clear the inner bore of the laminar ring 70 before stretching.

Figure 7:
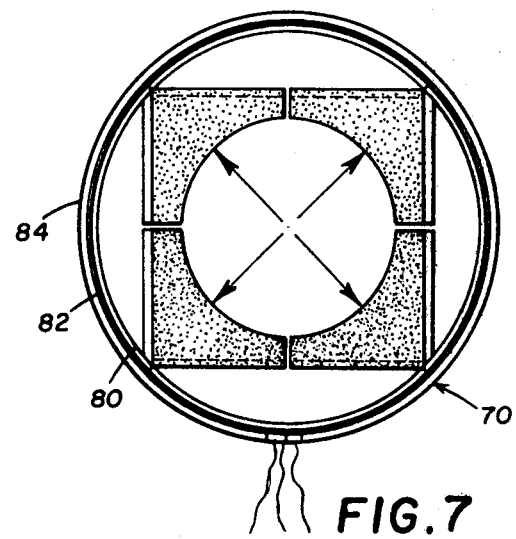
FIG. 7 is a side view of the coil frame illustrated in FIG. 5 and the forming tool illustrated in FIG. 6 in an unstretched configuration.
Figure 10:
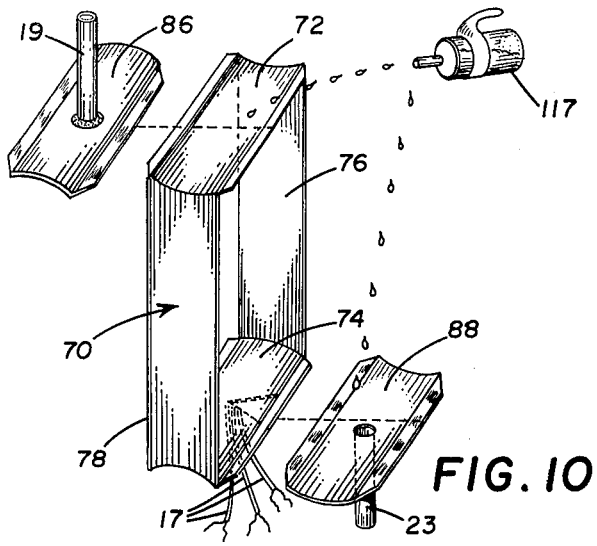
FIG. 10 is a perspective assembly drawing of the joining of the end pieces and half shafts illustrated in FIG. 10 to the coil frame illustrated in FIG. 4.

On each block, for example block 128, is a convex forming face 140 and a concave forming face 142 of substantially identical but reverse radius of curvature. These faces when the blocks are assembled together and placed within the laminar ring (formed as explained in FIG. 5) are expanded outwardly by a four jaw chuck equally in the direction of the arrows, as illustrated in FIG. 7, to stretch the ring into the generally rectangular or square concave-convex shape for coil frame 70 illustrated in FIG. 10.

By having the working surfaces of the section blocks of equivalent curvature the side legs 76, 78 of the coil frame 70 are formed precisely to the arcuate curvature and clearance of size of the air gap by the convex faces while the transverse legs 72, 74 are formed into equivalent channels for after filling with a bonding material by the concave faces. The tool 120 is expanded to a stop which accurately dimensions the coil frame 70. It is the ability to precisely determine the final dimensions of the coil frame 70 which provides many of the advantages for the driving mechanism 10 previously mentioned.

The equivalent curvature further permits the windings on the inner frame to remain substantially the same length during the coil formation as equal strains are applied to the frame legs during the stretching process.

It is seen preferably that the inner and outer frames are of stainless steel. Other metals and materials that may be shaped or formed in the manner illustrated and that are relatively light and thin in lamination can be used for the inner and outer frames. Further, the shape of the coil assembly need not be limited to the generally rectangular or square forming tool shown as the forming tool's shape can be changed to provide a coil frame that will fit a multiplicity of differently shaped air gaps. Also, the forming tool may be heated to facilitate the forming process if the material of the inner and outer frame is thermally formable.

Still further, the working faces of the tool are not necessarily limited to the preferred curvatures described but may be changed in order to enhance any of the advantages herebefore described.

Figure 8:
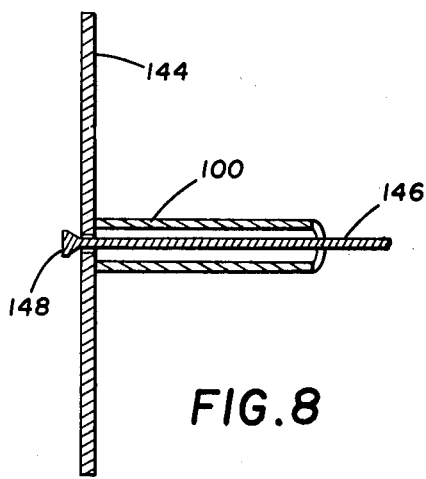
FIG. 8 is a cross sectional side view of an end piece and half shaft for the coil assembly illustrated in FIG. 4 before forming.
Figure 9:
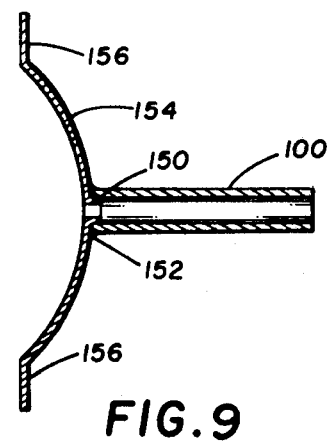
FIG. 9 is a cross sectional side view of the end piece and half shaft illustrated in FIG. 9 after forming.

Each end piece 86, 88 is formed identically and is attached to a half shaft by the steps illustrated in FIGS. 8 and 9. Initially an end piece in the form of a flat strip 144 is center punched and has a rod 146 with a wedge shaped tool end 148 passed through the punch. The half shaft 100 is held coaxial with the punch against the strip as the rod 146 is pulled through the inner bore of the half shaft. By additionally holding the edges 156 of the plate 144 stationary while the tool end 148 forms a flashing 150 within the half shaft 100, the rod 146 will shape the center of the plate into a curvature 154. The curvature 154 is designed to be the same arcuate shape as the legs of the coil frame 70. While positioned by the flashing 150 the half shaft 100 can be brazed to the end piece at 152. Preferably, the end pieces are formed from strips of 0.006 inch thick stainless steel. As described above, other materials may be used for the end pieces. Also, the end pieces may be formed by other processes such as stamping or the like.

The final assembly step in the manufacture of the coil assembly 12 is illustrated in FIG. 11 where the tabs of end piece 86 are joined to the tabs of the upper transverse leg of the coil frame 70 and the tabs of end piece 88 are joined to the tabs of the lower transverse leg of the coil frame 70. The juncture may be formed by electrical welds or other conventional techniques. Prior to the juncture of the end piece 88 to the coil frame the terminal leads 17 may be soldered or joined to the windings 82 through the notch (shown dotted) and brought out through the inner bore of half shaft 23.

The end pieces have a curvature oppositely directed to the concave channel like curvature of the coil frame 70 and thus form an interspace that is filled by a bonding material 117 to form a frame-epoxy-frame lamination similar to the coil frame. As previously described, the coil assembly 12 is subsequently cured by heating it for a predetermined time to set the epoxy.

Preferably, the bonding material 117 is Stycast 1095, a filled epoxy bonding agent produced by Emerson & Cummings of Canton, Massachusetts. The filler is a low density material (glass beads) which reduces the weight of the bonding material in the interspaces. The bonding material 117 can however, be the equivalents before mentioned, for the bonding material 116.

In this manner, the invention provides a laminar coil assembly 12 which is precisely dimensioned to obtain the advantages discussed. Further, the laminar structure is torsionally and structurally rigid without a through shaft. Since this strength is provided by the light laminar construction, the effect of the coil frame inertia on the response time of the coil assembly is negligible. In the preferred embodiment the coil frame 70 adds less than one-third to the total of the inertia of the windings while additionally protecting them from damage. A fast acting coil assembly is therefore provided according to one of the objects of the invention.

While the preferred embodiment of the invention has been disclosed, it will be understood that various modifications obvious to one skilled in the art can be made thereto without departing from the spirit and scope of the invention as covered by the appended claims.

What is claimed is:

1. In a driving mechanism for the pen of a recorder wherein the mechanism includes a rotatable coil assembly located in an air gap defined between an essentially cylindrical core and a surrounding essentially cylindrical shell, an improved coil assembly, comprising:

an inner, rectangular frame formed from at least one thin resilient strip, said frame having spaced upper and lower transverse legs along which said strip has an outwardly concave form, and spaced longitudinal side legs along which said strip has an outwardly convex form, said transverse legs being joined to said side legs to form said frame;

a plurality of coil turns wound on and laminated to said inner frame;

an outer, rectangular frame formed from at least one further thin resilient strip, said outer frame being laminated to said inner frame and said coil turns whereby said outer frame has further, spaced upper and lower transverse legs of outwardly concave form and further, spaced longitudinal side legs of outwardly convex form;

a first end cap having a first mounting shaft mounted on said further upper transverse leg; and a second end cap having a second mounting shaft mounted on said further lower transverse leg, said first and second mounting shafts being positioned coaxially to permit rotation of said coil assembly in said air gap.

2. The improvement of claim 1, further comprising a bonding material for rigidly holding together said inner frame, said coil turns and said outer frame.

3. The improvement of claim 1, wherein said outwardly concave and outwardly convex forms are of equal radii of curvature.

4. The improvement of claim 1, wherein said first and second end caps are formed of thin resilient material and have an outwardly convex shape opposite to the outwardly concave shape of said upper and lower transverse legs, thereby defining a space therebetween, said space being filled with bonding material to increase the rigidity of said transverse legs.

5. The improvement of claim 1, wherein at least one of said first and second mounting shafts is hollow and said outer frame comprises at least one aperture for allowing connection of external leads to said coil turns via said at least one hollow mounting shaft.

* * * * *